United States Patent [19]
Swart et al.

[11] Patent Number: 5,963,960
[45] Date of Patent: *Oct. 5, 1999

[54] METHOD AND APPARATUS FOR QUEUING UPDATES IN A COMPUTER SYSTEM

[75] Inventors: Garret F. Swart, Palo Alto; Roger J. Bamford, Woodside; Boris Klots, Palo Alto, all of Calif.

[73] Assignee: Oracle Corporation, Redwood Shores, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/739,353

[22] Filed: Oct. 29, 1996

[51] Int. Cl.$^6$ .................................................. G06F 15/40
[52] U.S. Cl. ................ 707/202; 364/222.82; 364/265.3; 364/266.5; 395/182.13; 711/155; 711/156
[58] Field of Search ............................... 395/182.18, 617, 395/618, 182.03, 620, 608, 181; 707/103; 711/113; 1/1

[56] References Cited

U.S. PATENT DOCUMENTS

| | | | |
|---|---|---|---|
| 4,949,251 | 8/1990 | Griffin et al. | 395/182.18 |
| 5,255,387 | 10/1993 | Arnold et al. | 395/617 |
| 5,276,885 | 1/1994 | Milnes et al. | 707/103 |
| 5,327,551 | 7/1994 | Kaneko | 395/182.03 |
| 5,386,554 | 1/1995 | Nozaki | 395/618 |
| 5,455,947 | 10/1995 | Suzuki et al. | 395/620 |
| 5,499,367 | 3/1996 | Bamford et al. | 395/608 |
| 5,581,750 | 12/1996 | Haderle et al. | 395/618 |
| 5,586,247 | 12/1996 | Yoshifuji et al. | 395/181 |
| 5,600,816 | 2/1997 | Oldfield et al. | 711/113 |
| 5,682,513 | 10/1997 | Candelaria et al. | 1/1 |

Primary Examiner—John W. Cabeca
Assistant Examiner—Fred F. Tzeng
Attorney, Agent, or Firm—McDermott, Will & Emery

[57] ABSTRACT

A method for updating and reading data stored in a static memory in a computer system is disclosed. An update queue stores one or more update records in dynamic memory that specify changes made by a transaction to data stored in the static memory. If a transaction requests data for which the transaction has previously generated an update record updated data is generated in dynamic memory, where the updated data reflecting the changes specified by the update records. The updated data is then supplied to the transaction.

19 Claims, 10 Drawing Sheets

METHOD AND APPARATUS FOR QUEUING UPDATES IN A COMPUTER SYSTEM

FIELD OF THE INVENTION

The present invention relates to updating data in computer systems, and more specifically, to a method and apparatus for queuing updates to data in a computer system.

BACKGROUND OF THE INVENTION

In the field of database design, new and more efficient methods for updating and reading data are constantly being sought. Because dynamic memory is generally faster than static memory, a desirable system minimizes the frequency and duration of accesses to static memory. Accordingly, various approaches have been developed that perform data update operations in dynamic memory. However, performing update operations in dynamic memory creates the possibility that the data in static memory may not be valid because the data in static memory does not reflect a modification that has been made to the corresponding data maintained in dynamic memory.

Figure 1:
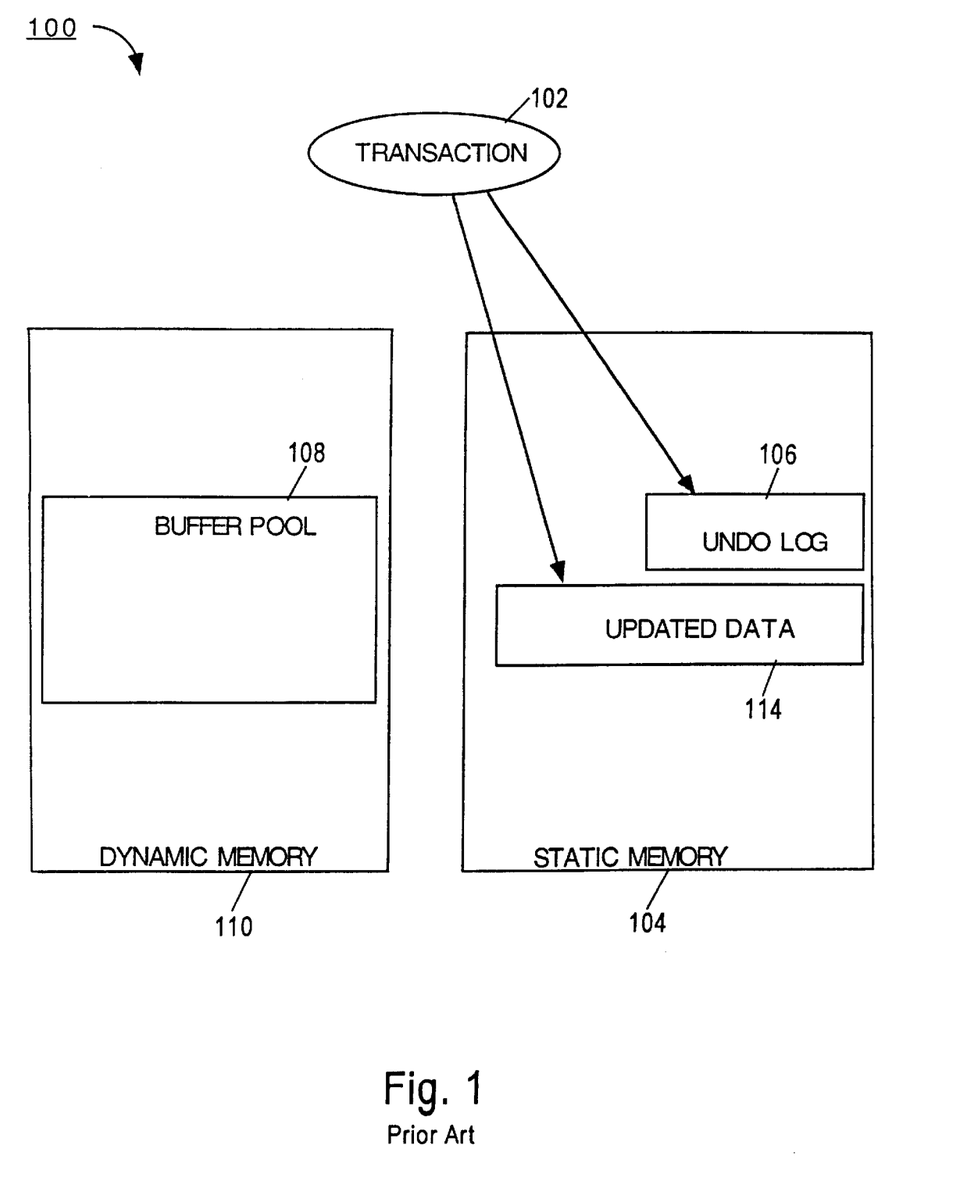
FIG. 1 shows a database system that uses one approach to performing an update operation in a computer system.

FIG. 1 shows a database system 100 that uses one approach to performing an update operation. In system 100, transaction 102 directly updates data stored in static memory 104. When the transaction 102 modifies data in static memory 104, transaction 102 also generates an undo record and stores the undo record in undo log 106 in static memory 104. The undo record generated in response to an update operation contains information that may be used to remove the changes made during the update operation ("undo" the operation).

Figure 2:
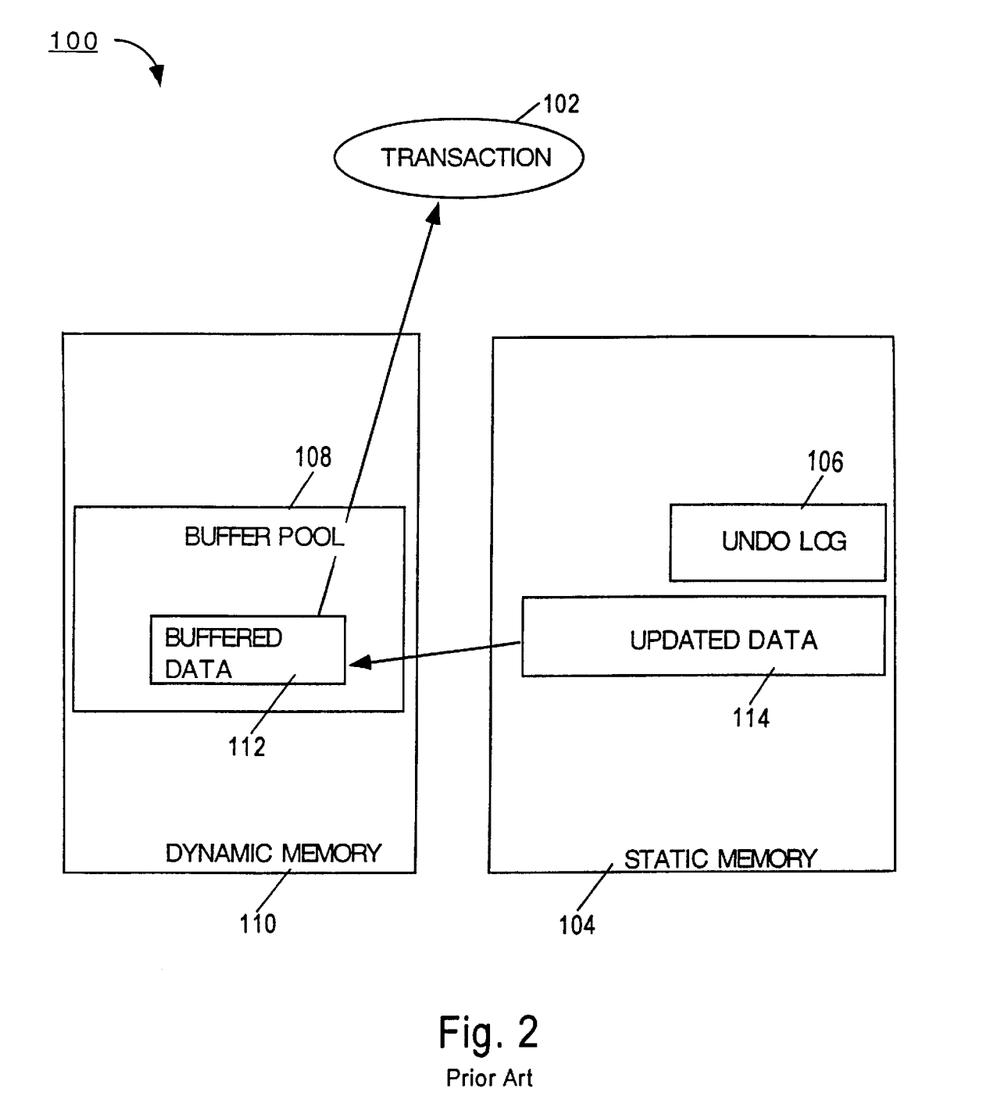
FIG. 2 shows a read operation may be performed in the database system of FIG. 1.

FIG. 2 shows how a read operation may be performed in system 100. When data 114 that has been updated is to be read by transaction 102, updated data 114 in static memory 104 is copied to a buffer in buffer pool 108 in dynamic memory 110. The buffered data is then accessed by transaction 102.

The update techniques used by system 100 have several disadvantages. As mentioned above, writing data to static memory 104 is generally slower than writing data to dynamic memory 110, an the direct-update technique used by system 100 accesses static memory 104 for every update. Furthermore, maintaining undo log 106 in static memory 104 requires an additional write operation to static memory 104 for every update. Thus, two writes to relatively slow static memory are required for each update operation. In systems where multiple transactions can run concurrently, transactions compete for permission to directly update data in the database, which may slow the completion of the transactions.

Figure 3:
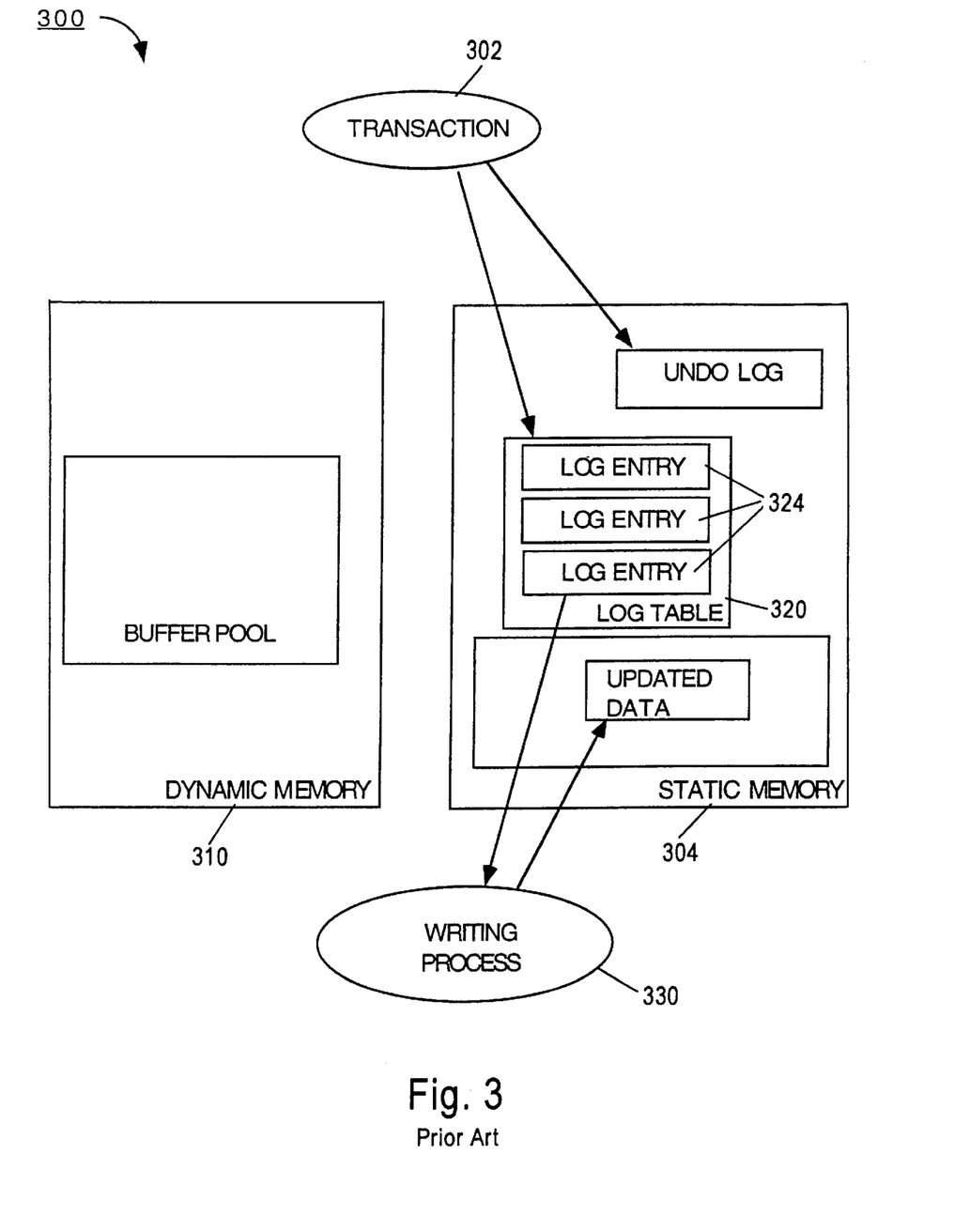
FIG. 3 a database system that uses another approach to performing an update operation in a computer system.

FIG. 3 shows a database system 300 that employs another approach to performing an update operation. In system 300, transaction 302 performs an update operation by writing update information as a log entry 324 stored in a log table 320 in static memory 304 rather than directly updating data in the database. The log entries 324 in the log table 320 describe the modifications to be made to data in static memory 304. Writing process 330 then performs the updates specified in the log entries 324 by modifying the data in the database. As with system 100, transactions in system 300 generate undo records so that updates may be "undone."

Figure 4:
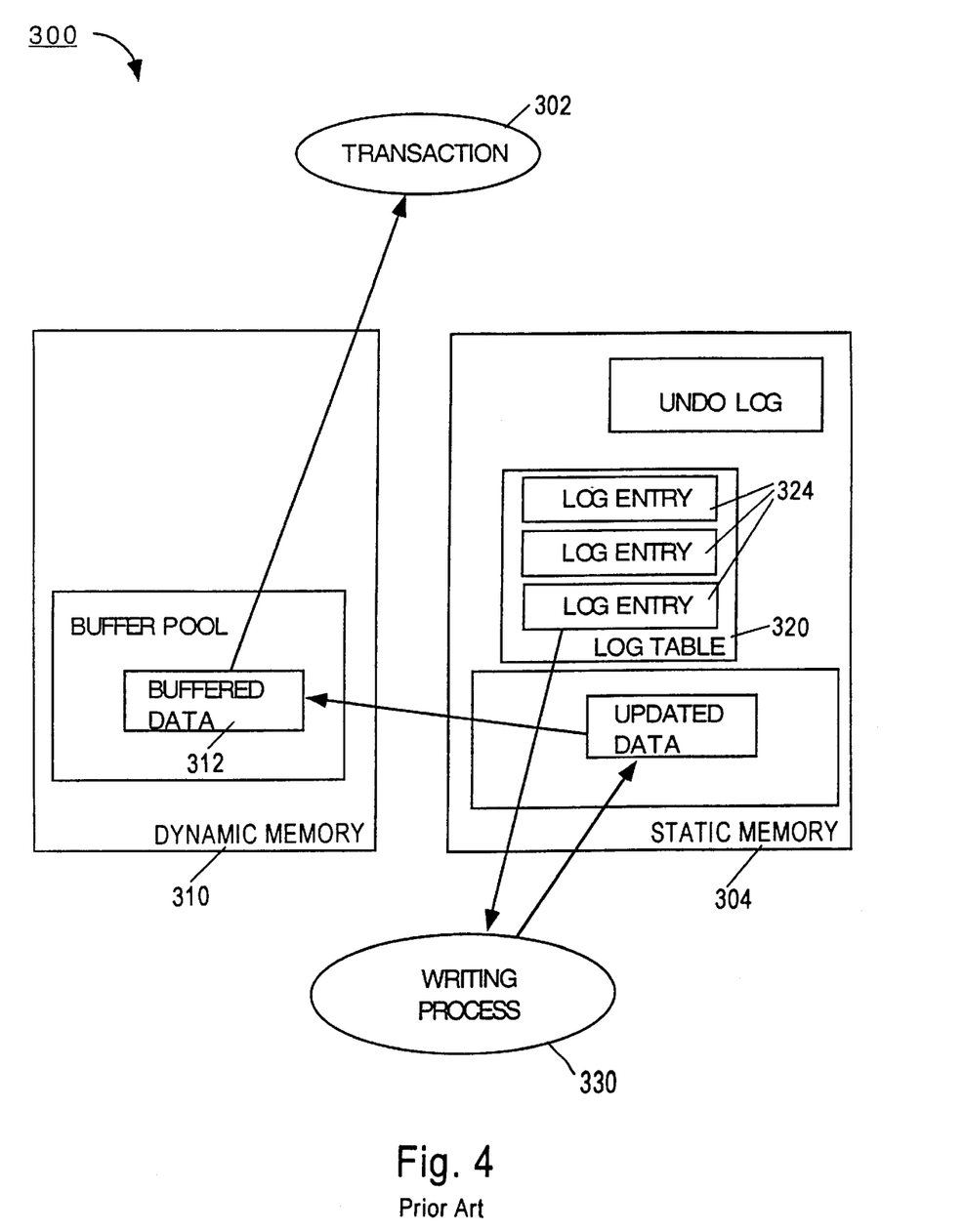
FIG. 4 shows how a read operation may be performed in the database system of FIG. 3.

FIG. 4 shows how a read operation may be performed in system 300. After writing process 330 updates the data in the database, the updated data may be copied from the database to dynamic memory 310 and stored as buffered data 312.

Buffered data 312 is then accessed by transaction 302. However, before transaction 302 can read data that has been updated, writing process 330 must have finished processing the appropriate log entry 324. If writing process 330 has not yet updated the data transaction 302 has requested, transaction 302 must wait.

Because transactions in system 300 do not update the database themselves, some contention issues that arise in system 100 are avoided. However, two writes to static memory 304 are still required for each update operation. Also, transaction 302 must wait for writing process 330 to update data in static memory before that updated data can be read. Because writing process 330 processes log entries 324 from many transactions, a transaction may be required to wait while writing process 330 performs updates to data other than the data desired by the transaction.

Thus, both systems 100 and 300 require transactions to perform two writes to static memory for each update operation. A desirable solution is to queue updates in dynamic memory until the final results of a transaction are determined. All of the modifications can be written to static memory without the possibility that the transaction will change the data again. Because final results are determined before update information is stored in static memory, an undo log is unnecessary.

SUMMARY OF THE INVENTION

In a computer system update records that describe modifications to data stored in static memory are stored in a queue in dynamic memory until the transaction causing the update operation completes successfully. When the transaction causing the update operation completes successfully, update records stored in the update queue are moved to a log table stored in static memory.

If a transaction causes a read operation, the requested data is copied from static memory and stored in dynamic memory. The transaction then determines whether it has previously caused an update operation to the data requested. If update records corresponding to the requested data exist, the modifications described by the update records are made to the requested data and the modified data is accessed by the transaction. Otherwise, the data copied from static memory is accessed.

DETAILED DESCRIPTION

A method and apparatus for queuing updates to data stored in a computer system is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The present invention is related to storing, in a queue, update records that describe update operations to be performed on data in a database. The update records are maintained in the update queue until the transaction causing the update operation has completed and the update records can be committed to disk. Further, access to the queued update records is allowed for the transaction that causes the update operation so that each transaction can access valid updated values for data that is has previously modified.

Figure 5:
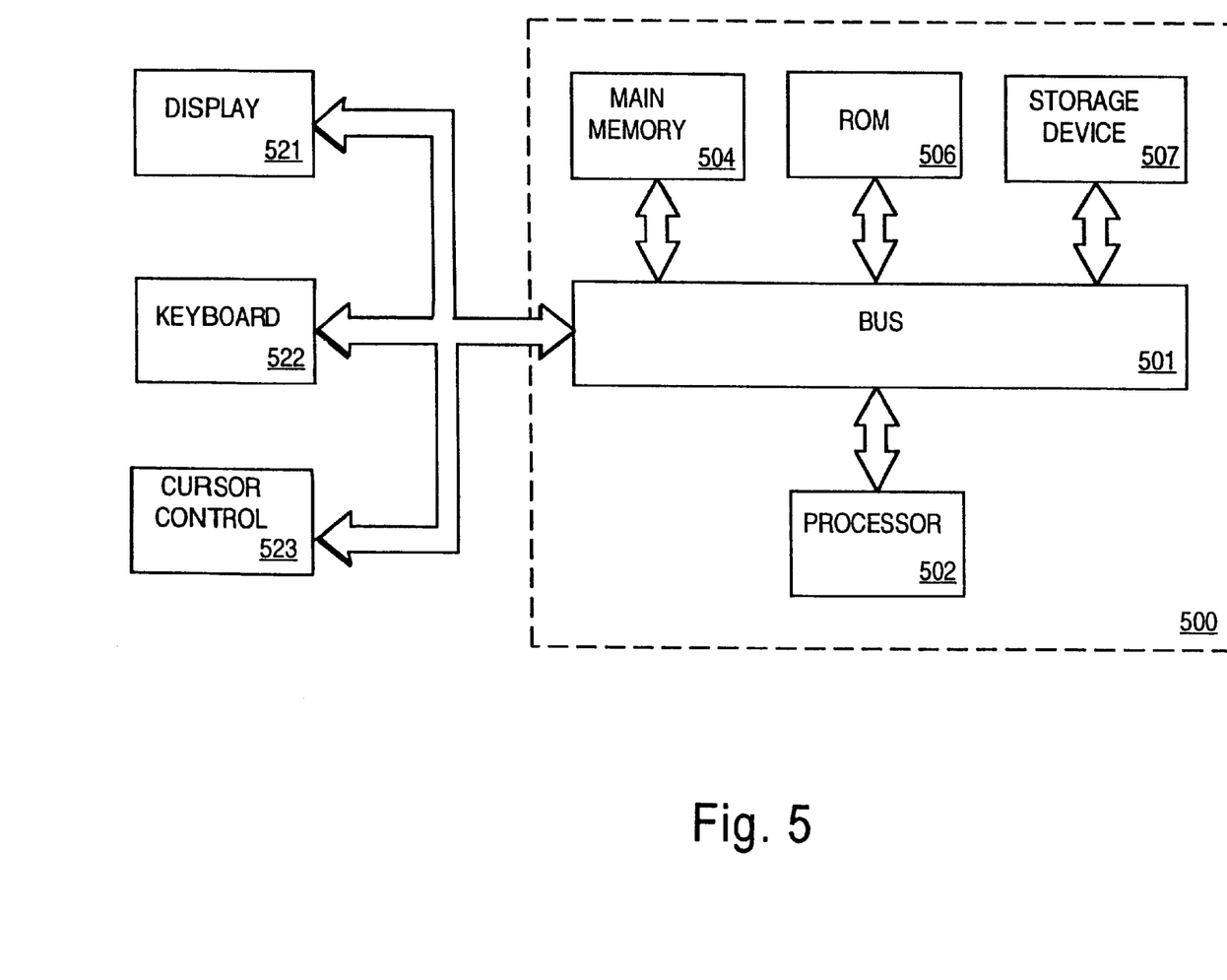
FIG. 5 a computer system upon which an embodiment of the present invention can be implemented.

FIG. 5 shows a computer system 500 upon which the preferred embodiment of the present invention can be implemented. Computer system 500 comprises a bus or other communication means 501 for communicating information, and a processing means 502 coupled with bus 501 for processing information. Computer system 500 further comprises a random access memory (RAM) or other dynamic storage device 504 (referred to as dynamic memory), coupled to bus 501 for storing information and instructions to be executed by processor 502. Dynamic memory 504 also may be used for storing temporary variables or other intermediate information during execution of instructions by processor 502. Computer system 500 also comprises a read only memory (ROM) and/or other static storage device 506 coupled to bus 501 for storing static information and instructions for processor 502. Data storage device 507 is coupled to bus 501 for storing information and instructions.

A data storage device 507 (referred to as static memory) such as a magnetic disk or optical disc and its corresponding drive can be coupled to computer system 500. Computer system 500 can also be coupled via bus 501 to a display device 521, such as a cathode ray tube (CRT), for displaying information to a computer user. An alphanumeric input device 522, including alphanumeric and other keys, is typically coupled to bus 501 for communicating information and command selections to processor 502. Another type of user input device is cursor control 523, such as a mouse, a trackball, or cursor direction keys for communicating direction information and command selections to processor 502 and for controlling cursor movement on display 521. This input device typically has two degrees of freedom in two axes, a first axis (e.g., x) and a second axis (e.g., y), which allows the device to specify positions in a plane.

Alternatively, other input devices such as a stylus or pen can be used to interact with the display. A displayed object on a computer screen can be selected by using a stylus or pen to touch the displayed object. The computer detects the selection by implementing a touch sensitive screen. Similarly, a light pen and a light sensitive screen can be used for selecting a displayed object. Such devices may thus detect selection position and the selection as a single operation instead of the "point and click," as in a system incorporating a mouse or trackball. Stylus and pen based input devices as well as touch and light sensitive screens are well known in the art. Such a system may also lack a keyboard such as 522 wherein all interface is provided via the stylus as a writing instrument (like a pen) and the written text is interpreted using optical character recognition (OCR) techniques.

The present invention is related to the use of computer system 500 to queue update records for update operations until the transaction performing the update operations has completed successfully. According to one embodiment, queuing update records is performed by computer system 500 in response to processor 502 executing sequences of instructions contained in dynamic memory 504. Execution of the sequences instructions contained in dynamic memory 504 causes processor 502 to place, in a queue, update records that specify changes to be made to data in static memory 507 as will be described hereafter. In alternative embodiments, hard-wired circuitry may be used in place of or in combination with software instructions to implement the present invention. Thus, the present invention is not limited to any specific combination of hardware circuitry and software.

Figure 6:
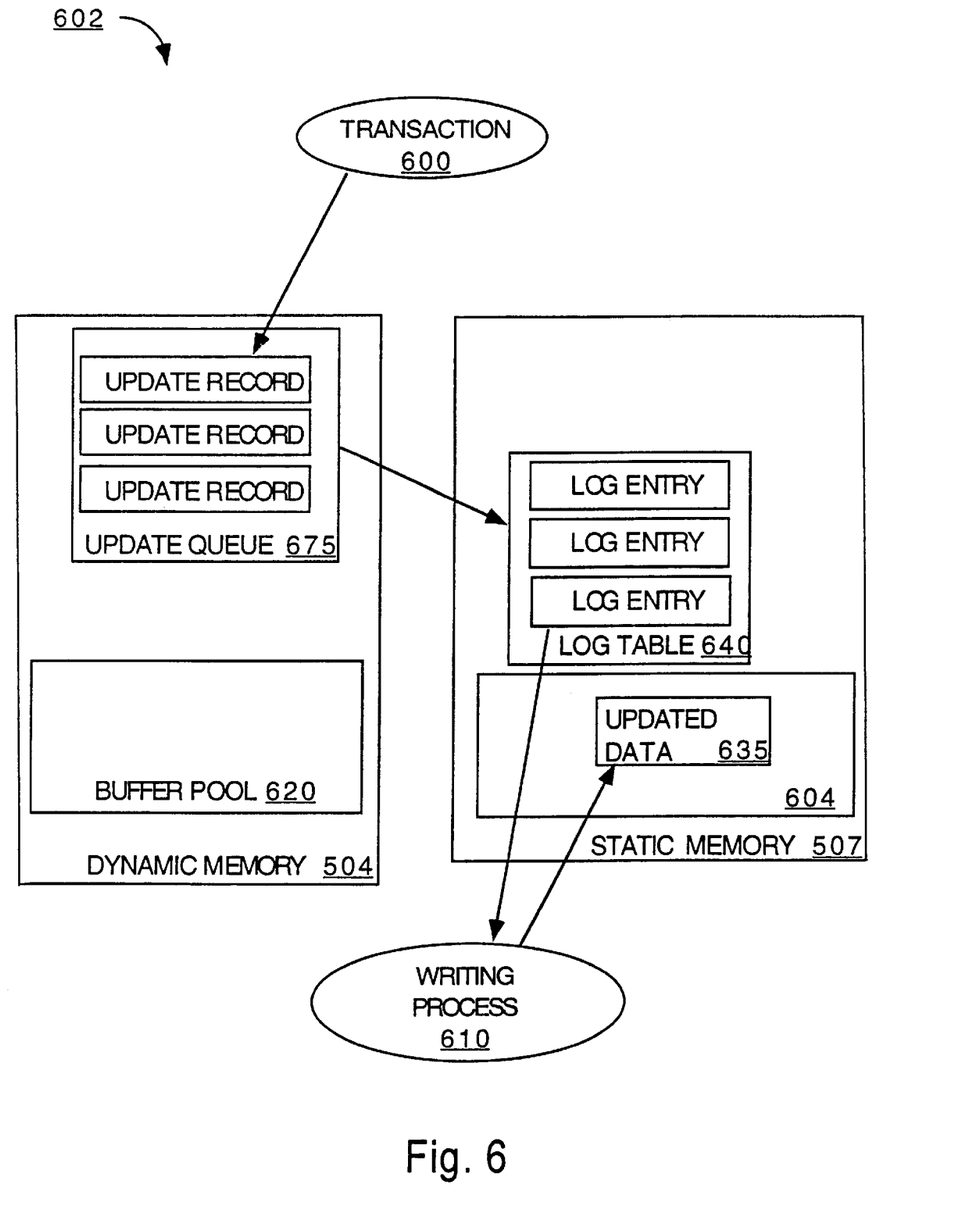
FIG. 6 is a block diagram of a database system where transactions queue updates in dynamic memory according to one embodiment of the invention.

FIG. 6 is a database system 602 that uses one an approach to queuing updates to data stored in static memory. In system 602, a transaction 600 indirectly performs updates to data stored in a database 604 by writing update information to update queue 675 in the form of update records. When transaction 600 completes, the update records contained in update queue 675 are stored in log table 640 as log entries. Writing process 610 then processes log entries of log table 640 to generate updated data 635. Writing process 610 operates independently of transaction 600 or any other transaction performing update operations. Thus, transaction 600 is not required to access static memory 507 during an update operation.

Each transaction should see the database in a transaction-consistent state. A transaction-consistent state is a state in which the database reflects either all or none of the changes for each transaction other than the transaction doing the reading. The reading transaction should see the changes that it has made. Systems 100 and 300 generate undo records for all operations that modify the database so that the changes may be removed from the database if the transactions are unable to complete successfully.

In system 602, the update records in update queue 675 are not copied to the log table 640 in static memory 507 unless and until transaction 600 that made the updates reflected in the update records has completed successfully. After the update records are copied to log table 640, there is no chance that transaction 600 will not complete successfully. Consequently, there is no need to be able to undo the changes, so no undo records need to be generated.

Using the technique described above, transaction 600 does not have access to the modified values of data that transaction 600 has previously updated. Specifically, the update records generated by transaction 600 are not processed until transaction 600 completes. Thus, if transaction 600 generates an update record to modify data, then attempts to read the data it updated from static memory 507, invalid data will be obtained.

Therefore, a desirable data storage system queues update records until all of the operations of a specific transaction are completed and the final results can be committed to static memory 507. In addition, the queued update records should be available to the transaction so that valid data is available.

Figure 7:
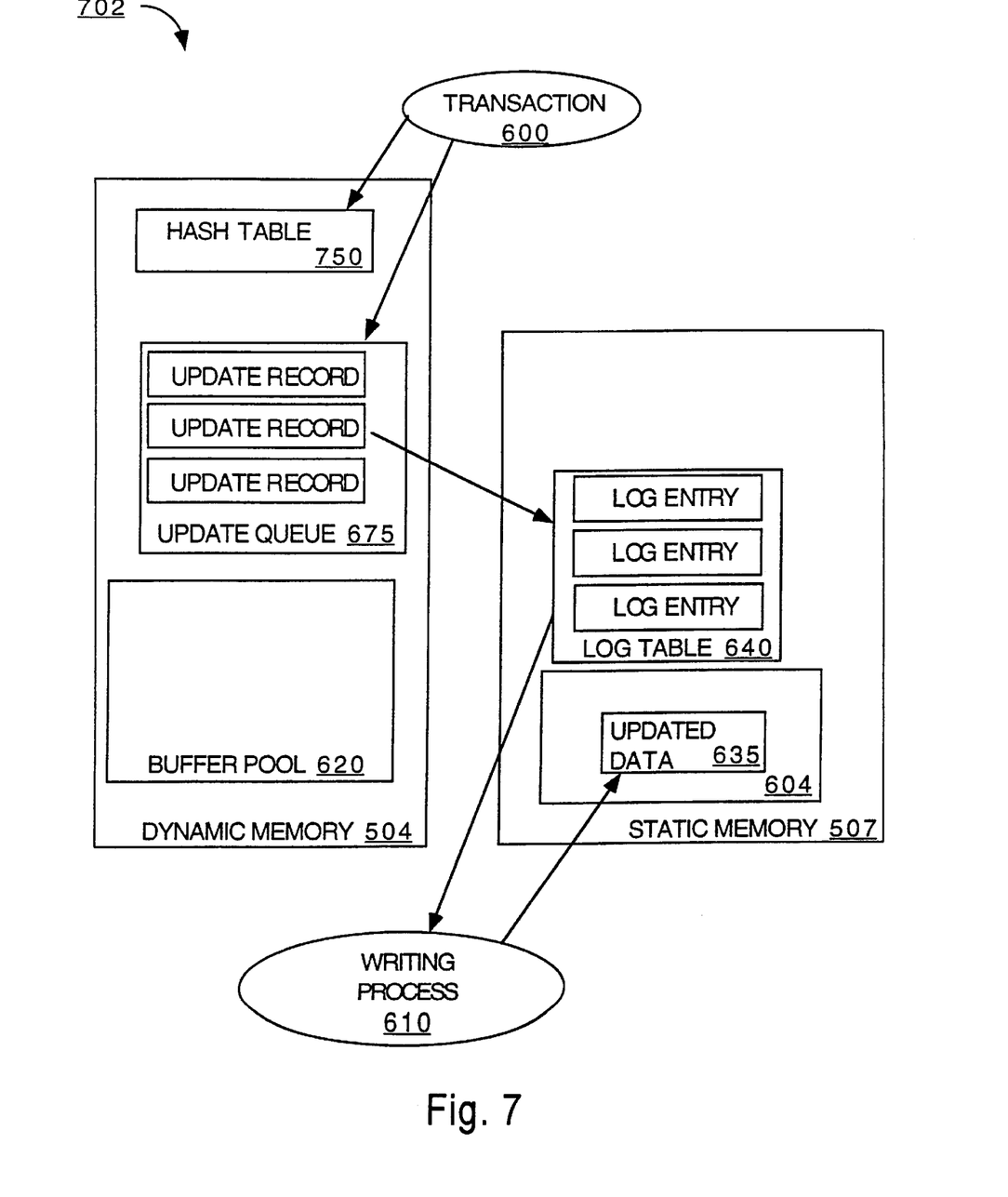
FIG. 7 is a block diagram that illustrates how update operations may be performed according to one embodiment of the present invention.

FIG. 7 shows a database system 702 that makes modified data available to transactions that performed the modification according to one embodiment of the present invention. Just as in system 602, in system 702, transaction 600 generates update records that specify changes to be made to data stored in database 604. Update records are stored in update queue 675 in dynamic memory 504. When transaction 600 completes, the update records of update queue 675 are stored as log entries in log table 640, which is maintained in static memory 507. Writing process 610 then processes log entries in log table 640 to generate updated data 635.

According to one embodiment, the formats of the update records and the log entries are identical. Maintaining the update records and the log entries with the same format eliminates the need for translation at the completion of each transaction, however, various formats may be used.

Unlike system 602, system 702 includes a hash table that is used in a mechanism which allows transaction 600 to access modified versions of data that has previously been modified. When transaction 600 performs an update operation, an update record that specifies the update is stored in update queue 675. In addition, hash table 750 is modified to indicate that transaction 600 has generated an update record to modify the corresponding data in static memory 507. In one embodiment, an identifier of the data to be updated (e.g., an object identifier) is used to index the hash table. A flag is set in the hash table entry indexed by the identifier to indicate that the data corresponding to the identifier that hashes to the entry has been modified. While the invention shall be described with reference to an embodiment that uses a hash table, any appropriate method may be used to indicate that update records have been generated to modify particular data.

Figure 8:
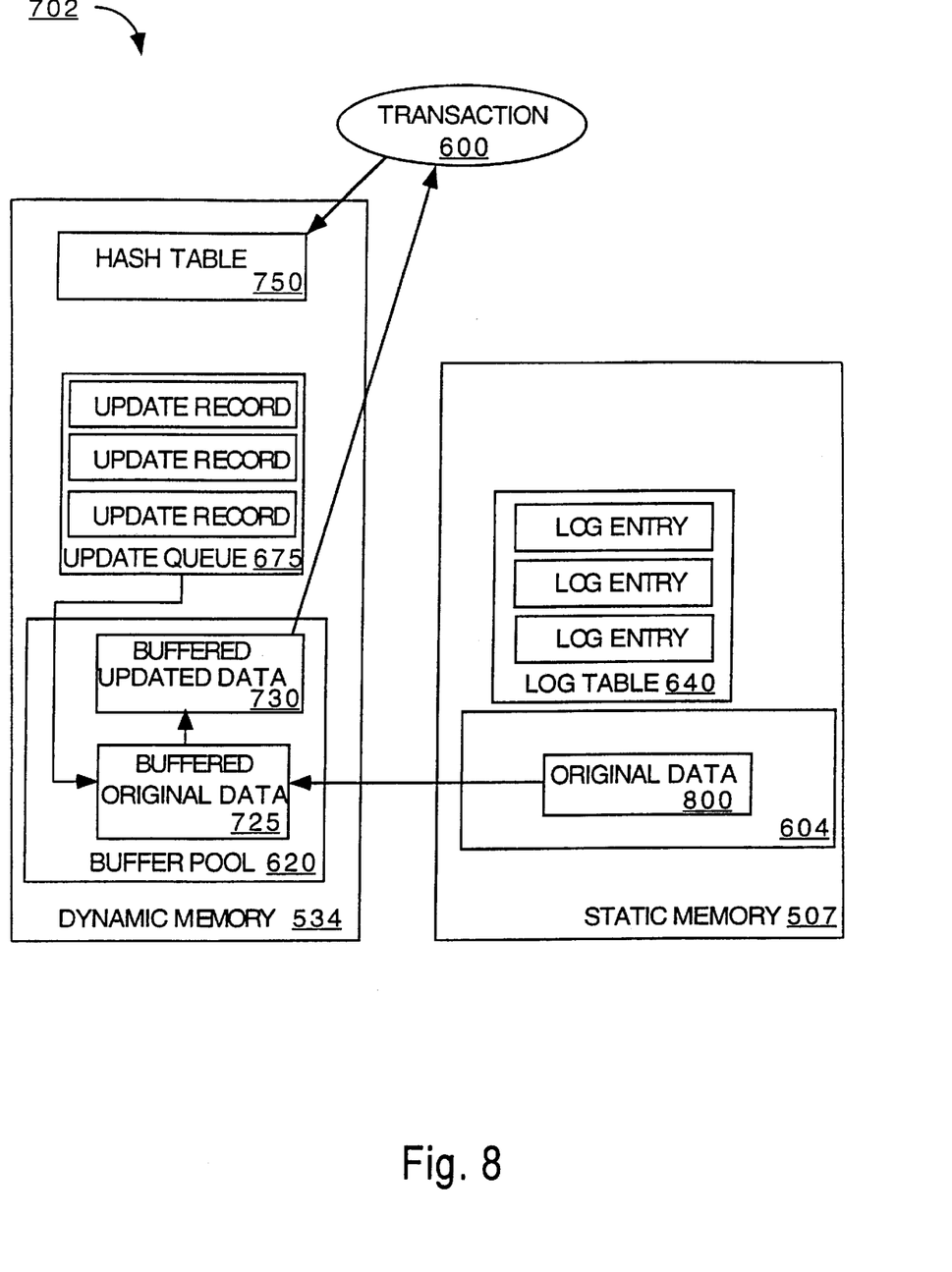
FIG. 8 is a block diagram that illustrates how read operations may be performed according to one embodiment of the present invention.

FIG. 8 shows how a read operation may be performed in system 702 according to one embodiment of the present invention. Original data 800, stored in static memory 507, is copied to buffer pool 620 (shown as buffered original data 725), when transaction 600 attempts to read the object (table, row, etc.) that corresponds to the original data 800. Transaction 600 uses the identifier of the object as an index to hash table 750 to determine whether any update records in update queue 675 correspond to the object. If the flag at the entry of hash table 750 that is indexed by the identifier indicates that the target object has not previously been modified by transaction 600, then buffered original data 725 is accessed by transaction 600.

If the flag indicates that transaction 600 has previously modified the object, then one or more of the update records in update queue 675 specify updates to original data 800. Transaction 600 applies the updates specified in the appropriate update records to the buffered original data 725 to generate buffered updated data 730. Buffered updated data 730 reflects the changes specified by the update records applied to original data 800. Transaction 600 then accesses buffered updated data 730.

In one embodiment, buffered updated data 730 is stored in a cache so that the same set of update records do not have to be applied again to generate the same buffered updated data 730 for all subsequent attempts by transaction 600 to read the same object. Another advantage of retaining the updated data in a cache is that data stored in the cache may be used as intermediate data. Specifically, if the transaction performs a subsequent update on the data then attempts to read the data again, only update records generated after the buffered updated data is generated need to be applied to the updated data in the cache to produce a version of the data that reflects all of the modifications made by the transaction. Thus fewer steps are required to generate later updated data.

Figure 9:
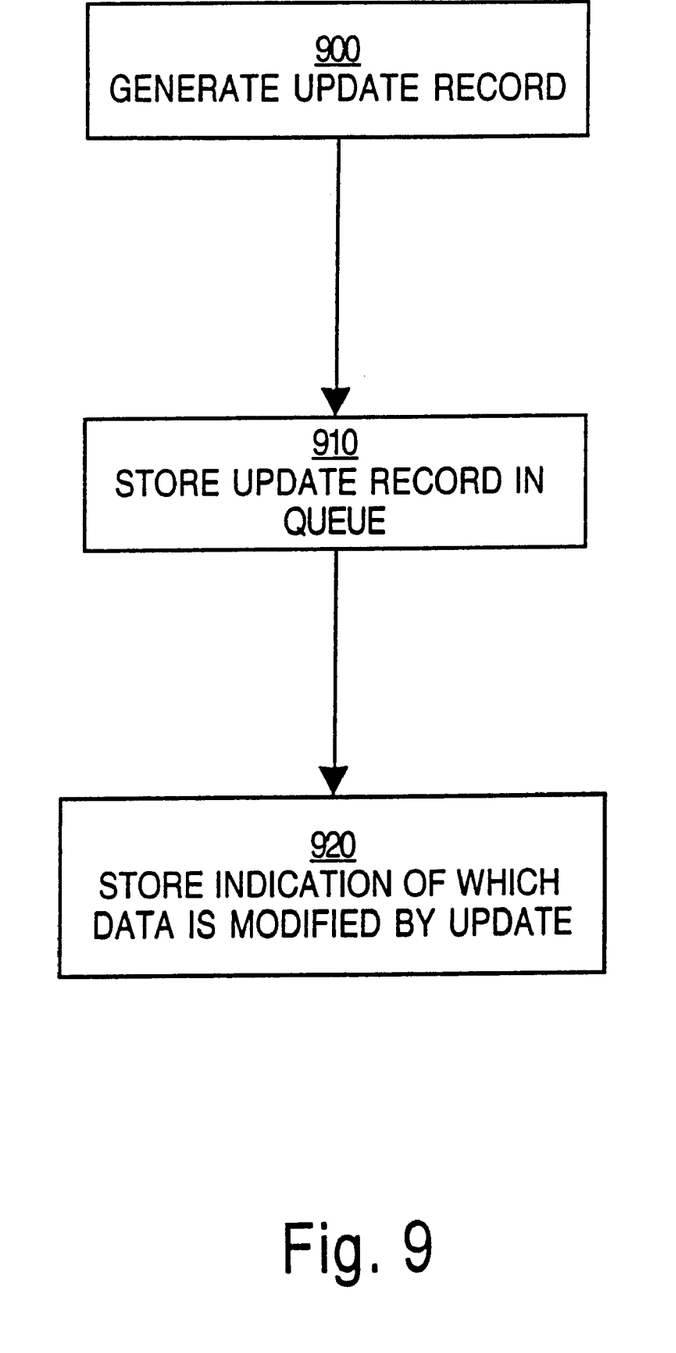
FIG. 9 is a flow diagram that illustrates the steps for queuing updates to data according to one embodiment of the present invention.

FIG. 9 is a flow diagram that shows the steps for an update operation according to one embodiment of the present invention. In step 900, the transaction generates an update record that specifies modifications to be made to corresponding data stored in static memory. In step 910, the update record is stored in an update queue that is maintained in dynamic memory. In step 920, the transaction indicates which data stored in static memory corresponds to the update record generated in step 900. According to one embodiment, a hash table is maintained in dynamic memory to indicate which data have been modified.

Figure 10:
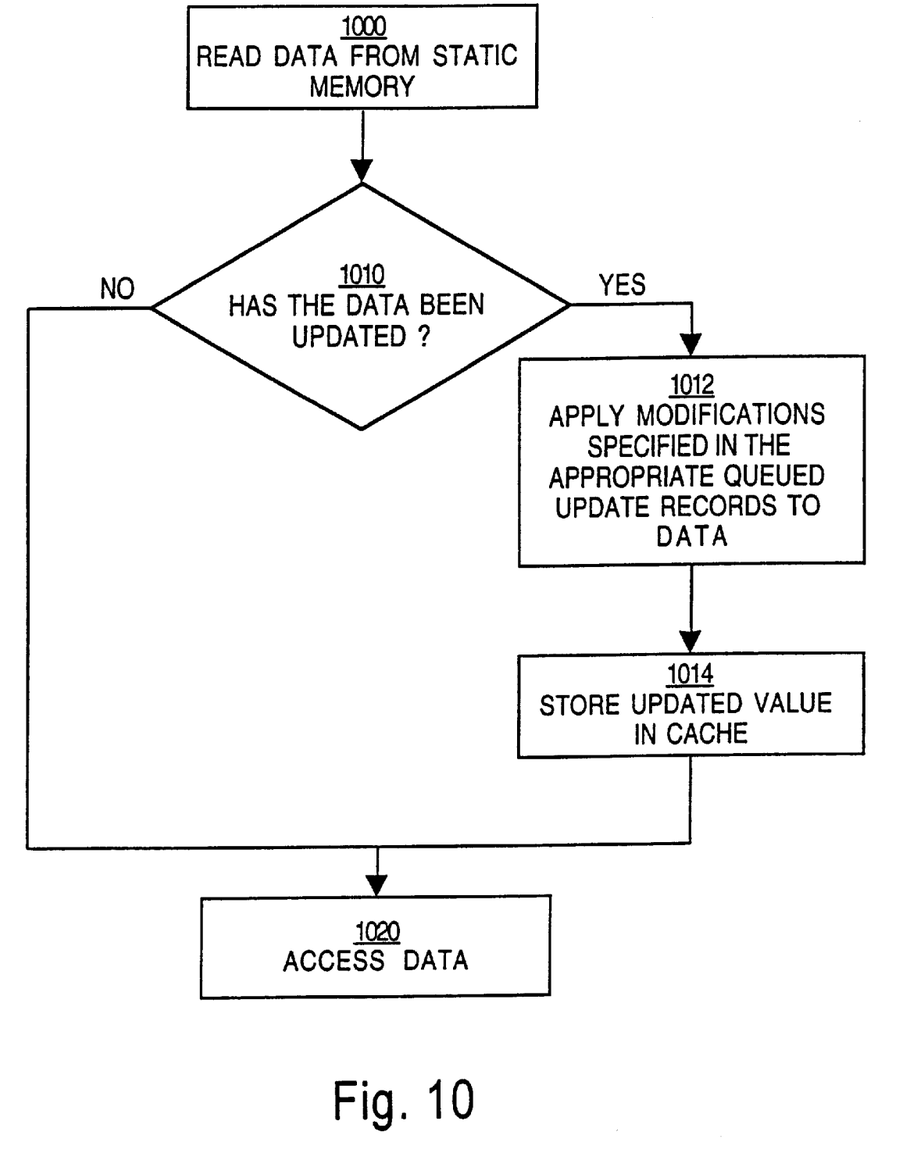
FIG. 10 is a flow diagram that illustrates the steps for reading data stored in a computer system that queues updates according to one embodiment of the present invention.

FIG. 10 is a flow diagram that shows steps for a read operation according to one embodiment of the present invention. In step 1000, requested data is read from static memory and placed in buffer pool 620. In step 1010, transaction 600 determines whether transaction 600 has previously generated any update records corresponding to the requested data. In a system that uses a hash table, this may be performed, for example, by using an identifier associated with the requested data as an index into the hash table. The value stored in the hash table indicated by the identifier will indicate whether the data has been updated. If transaction 600 has not generated any update records corresponding to the version of the requested data that was read from static memory, the requested data is valid and is accessed by transaction 600 in step 1020.

If transaction 600 has generated update records corresponding to the requested data, the modifications specified in the appropriate update records in update queue 675 are applied to the data read from static memory to generate updated data in step 1012. Once the modifications have been applied to the data read from static memory, valid data is obtained and is accessed by transaction 600 in step 1020.

Step 1014 is an optional step according to one embodiment of the present invention. In step 1014, data that has been updated according to the modifications specified in update records stored in update queue 675 is stored in a cache memory. By storing the updated version of the data in a cache memory, the need to apply the same set of update records to the same original data is eliminated for subsequent reads of the same data because the corresponding intermediate results are available from the cache memory. In addition, later update records may be applied to intermediate results stored in the cache memory rather than applying all relevant update records to data obtained from static memory.

In the foregoing specification, the invention has been described with reference to specific embodiments thereof. It will, however, be evident that various modifications and changes may be made thereto without departing from the broader spirit and scope of the present invention. The specification and drawings are, accordingly, to be regarded in an illustrative rather than restrictive sense.

What is claimed is:

1. A method for updating and reading data stored in a static memory in a computer system, comprising the steps of:

storing, in an update queue, one or more update records that specify changes made by a transaction to data stored in the static memory;

when the transaction makes a request to be provided data for which the transaction has previously generated an update record, detecting that the data requested by the transaction is data for which the transaction has previously generated an update record;

if the data requested by the transaction is data for which the transaction has previously generated an update record, then responding to the request by applying the update record to produce updated data in dynamic memory; and supplying the updated data to the transaction.

2. The method of claim 1 wherein the step of storing one or more update records further comprises the steps of:

generating an update record that specifies changes to be made by the transaction to particular data stored in static memory; and setting a value in dynamic memory to indicate that the transaction has specified modifications to said particular data.

3. The method of claim 2 wherein the step of setting a value includes the steps of:

using an identifier associated with said particular data to generate an index into a hash table; and setting a value in an entry of a hash table that corresponds to said index.

4. The method of claim 1 wherein the step of detecting that the data requested by the transaction is data for which the transaction has previously generated an update record comprises the step of checking a value stored in an entry of a hash table to determine whether data requested by the transaction has been updated by said transaction.

5. The method of claim 1 wherein the step of applying the update record to produce updated data in dynamic memory further comprises the steps of:

reading an original version of the data requested by the transaction from the static memory;

applying modifications specified in update records corresponding to the data requested by the transaction to the original data requested by the transaction to produce the updated data; and placing the updated data in a buffer in dynamic memory.

6. The method of claim 1 further comprising the steps of:

storing the one or more update records as entries in a log table, maintained in static memory, when the transaction successfully completes;

applying modifications specified in the entries in the log table to corresponding data in static memory such that the corresponding data in static memory reflects the changes specified by the update records.

7. The method of claim 6 wherein the update records in dynamic memory and the entries in the log table stored in static memory have the same format.

8. The method of claim 6 wherein the step of applying is performed by a second process operating independently of a process performing the transaction.

9. The method of claim 1, further including the step of indirectly updating a data item stored in the static memory by generating an update record that reflects the update to the data item without modifying the data item.

10. The method of claim 9, wherein said step of indirectly updating is performed without loading into dynamic memory any copy of said data item and no copy of said data item currently exists in said volatile memory.

11. A computer-readable medium carrying one or more sequences of one or more instructions for updating and reading data stored in a static memory, the one or more sequences of one or more instructions including instructions which, when executed by one or more processors, cause the one or more processors to perform the steps of:

storing, in an update queue, one or more update records that specify changes made by a transaction to data stored in the static memory;

detecting when the transaction requests data for which the transaction has generated an update record;

generating updated data in dynamic memory if the transaction requests data for which the transaction has generated an update record, the updated data reflecting the changes specified by the update records; and supplying the updated data to the transaction.

12. The computer-readable medium of claim 11 wherein said one or more sequences of instructions further include sequences of instructions which, when executed by the processor, cause the processor to perform the steps of:

generating an update record that specifies changes to be made by the transaction to particular data stored in static memory; and setting a value in dynamic memory to indicate that the transaction has specified modifications to said particular data.

13. The computer-readable medium of claim 12 wherein said one or more sequences of instructions farther include sequences of instructions which, when executed by the processor, cause the processor to perform the steps of:

using an identifier associated with said particular data to generate an index into a hash table; and setting a value in an entry of a hash table that corresponds to said index.

14. The computer-readable medium of claim 11 wherein the step of detecting that the data requested by the transaction is data for which the transaction has previously generated an update record comprises the step of checking a value stored in an entry of a hash table to determine whether data requested by the transaction has been updated by said transaction.

15. The computer-readable medium of claim 11 wherein the step of applying the update record to produce updated data in dynamic memory further comprises the steps of:

reading an original version of the data requested by the transaction from the static memory;

applying modifications specified in update records corresponding to the data requested by the transaction to the original data requested by the transaction to produce the updated data; and placing the updated data in a buffer.

16. The computer-readable medium of claim 11 wherein said one or more sequences of instructions further include sequences of instructions which, when executed by the processor, cause the processor to perform the steps of:

storing the one or more update records as entries in a log table, maintained in static memory, when the transaction successfully completes;

applying modifications specified in the entries in the log table to corresponding data in static memory such that the corresponding data in static memory reflects the changes specified by the update records.

17. The computer-readable medium of claim 11 wherein said one or more sequences of instructions further include sequences of instructions which, when executed by the processor, cause the processor to perform the step of applying entries in the log table with a second process independent of a process causing the transaction.

18. A method for updating data stored in a static memory in a computer system, comprising the steps of:

indirectly updating a data item stored in the static memory by generating an update record that reflects the update to the data item without modifying any copy of said data item; and storing said update record in an update queue in dynamic memory.

19. The method of claim 18, wherein said step of indirectly updating is performed without loading into dynamic memory any copy of the data item and no copy of said data item currently exists in said volatile memory.

* * * * *

UNITED STATES PATENT AND TRADEMARK OFFICE
CERTIFICATE OF CORRECTION

PATENT NO. : 5,963,960
DATED : October 5, 1999
INVENTOR(S) : F. Swart Garret et al.

It is certified that error appears in the above-identified patent and that said Letters Patent is hereby corrected as shown below:

<u>Colmn 10,</u>
Line 5, please insert the following claims:

20. A computer-readable medium carrying one or more sequences of one or more instructions for updating data stored in a static memory in a computer systems, the one or more sequences of one or more instructions including instructions which, when executed by one or more processors, cause the one or more processors to perform steps of:
indirectly updating a data item stored in the static memory by generating an update record that reflects the update to the data item without modifying any copy of said data item; and storing said update record in an update queue in dynamic memory.

21. The computer-readable medium of Claim 20, wherein said step of indirectly updating is performed without loading into dynamic memory any copy of the data item and no copy of said data item currently exists in said volatile memory.

Signed and Sealed this

Twenty-ninth Day of July, 2003

JAMES E. ROGAN
*Director of the United States Patent and Trademark Office*